(12) United States Patent
Yoo et al.

(10) Patent No.: US 6,673,706 B2
(45) Date of Patent: Jan. 6, 2004

(54) METHOD OF FORMING A PATTERN USING A PHOTORESIST WITHOUT EXPOSING THE PHOTORESIST AND SILICIDATION METHOD INCORPORATING THE SAME

(75) Inventors: Ji-yong Yoo, Suwon (KR); Dae-youp Lee, Gunpo (KR); Jeung-woo Lee, Suwon (KR); Suk-joo Lee, Yongin (KR); Jae-han Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/023,982

(22) Filed: Dec. 21, 2001

(65) Prior Publication Data
US 2002/0119403 A1 Aug. 29, 2002

(30) Foreign Application Priority Data
Dec. 26, 2000 (KR) .......................................... 2000-82054

(51) Int. Cl.⁷ ........................ H01L 21/3205; G03C 5/00; G03C 1/52
(52) U.S. Cl. ........................ 438/592; 438/725; 430/317; 430/330; 430/190
(58) Field of Search ........................ 438/592, 718, 438/720, 725; 430/313, 317, 330, 190.93

(56) References Cited

U.S. PATENT DOCUMENTS 5,346,799 A * 9/1994 Jeffries et al. .............. 430/192
5,395,915 A * 3/1995 Iimuro et al. ............... 528/137
6,462,369 B1 * 10/2002 Matsufusa ................... 257/296

FOREIGN PATENT DOCUMENTS

| JP | 11-163326 | 6/1999 |
| JP | 11163326 | 6/1999 |
| KR | P1998-063925 | 10/1998 |
| KR | 2000-0000885 | 1/2000 |

* cited by examiner

*Primary Examiner*—John F. Niebling
*Assistant Examiner*—Ron Pompey
(74) *Attorney, Agent, or Firm*—Volentine Francos, PLLC

(57) ABSTRACT

A photoresist pattern is formed, without being exposed, by using photoresist having a residual layer proportion characteristic by which the photoresist dissolves at a suitable rate in a developing solution. First, a target layer to be patterned and a photoresist layer are sequentially formed on a substrate having a pattern that defines a step on the substrate. Some of the photoresist layer is treated with the developing solution, to thereby form a photoresist pattern whose upper surface is situated beneath the step and hence, exposes part of the target layer. Next, the exposed part of the target layer, and the photoresist pattern are removed. A silicidation process may be carried out thereafter on the area(s) from which the target layer has been removed. The method is relatively simple because it does not involve an exposure process. Furthermore, the method can be used to manufacture devices having very fine linewidths, i.e., a small design rule, because it is not subject to the misalignment errors which can occur during a conventional exposure process.

20 Claims, 21 Drawing Sheets

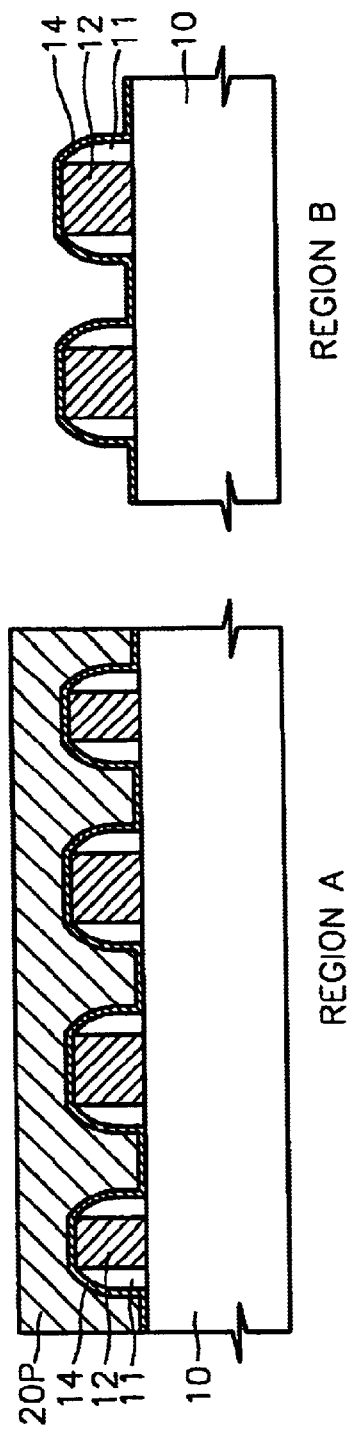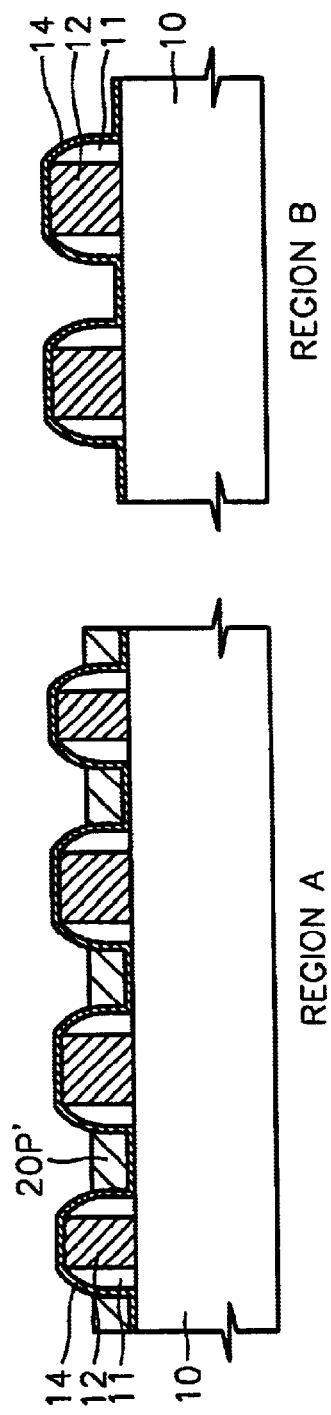

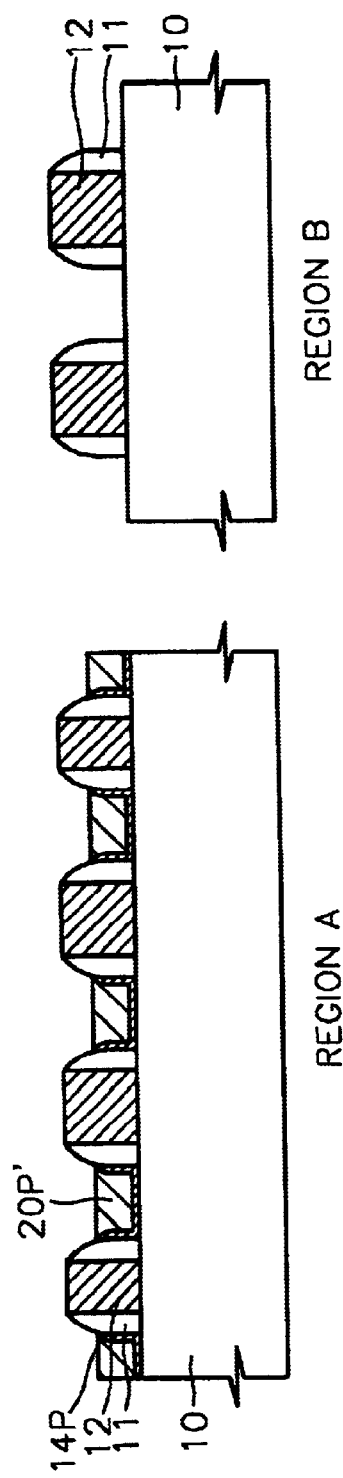
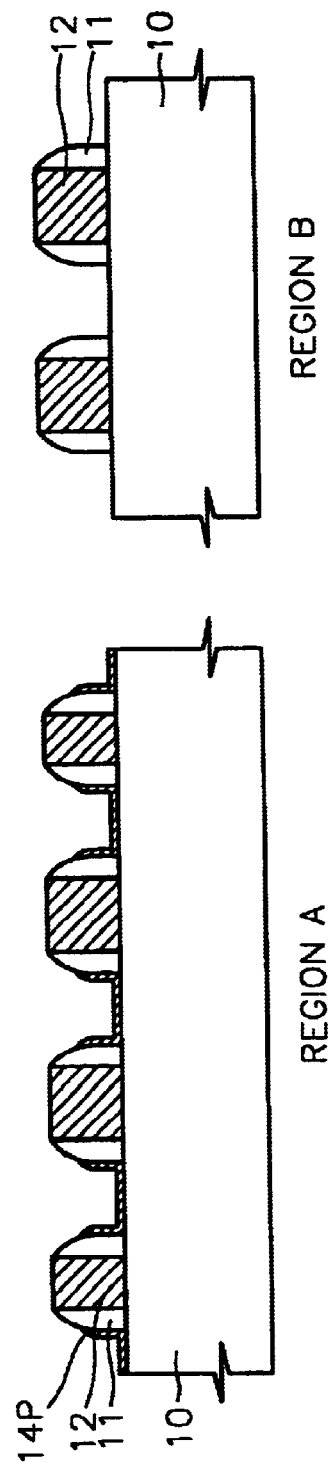
FIG. 13 (PRIOR ART)
FIG. 14 (PRIOR ART)

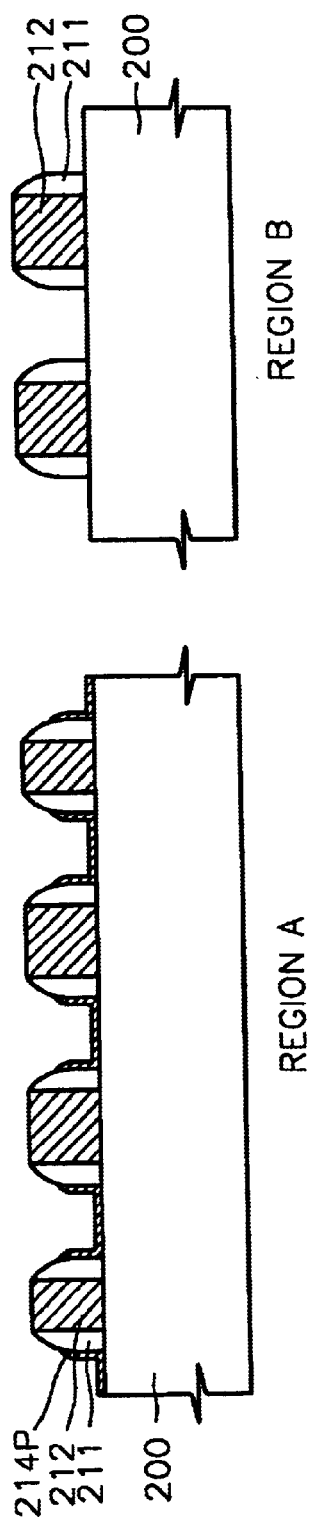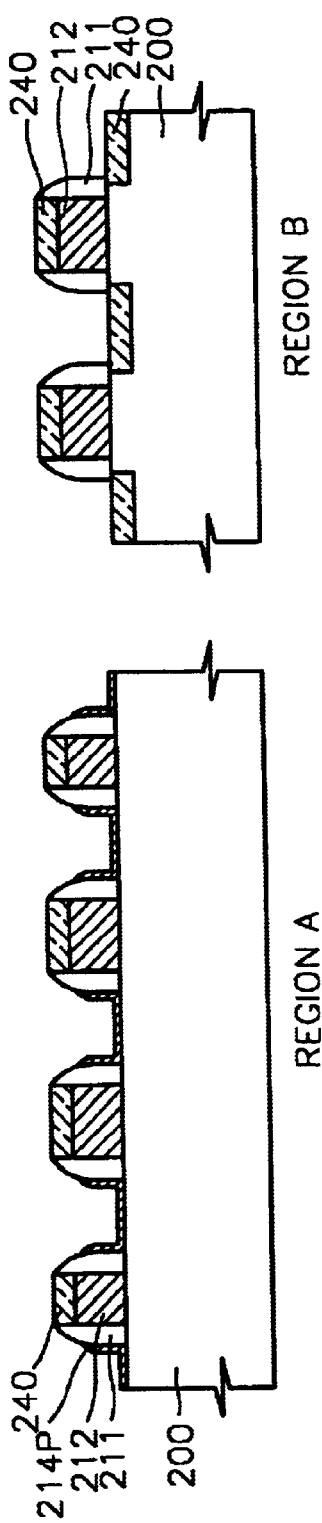

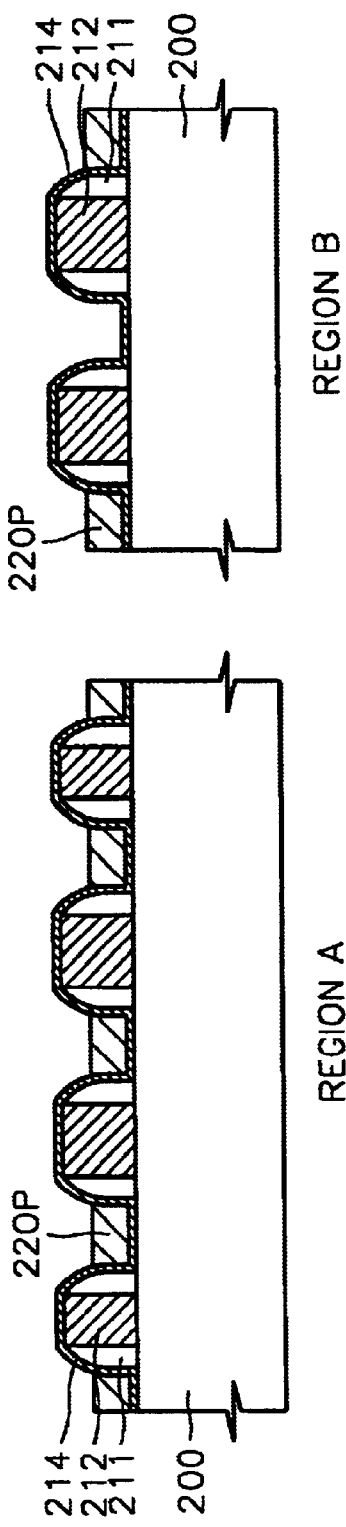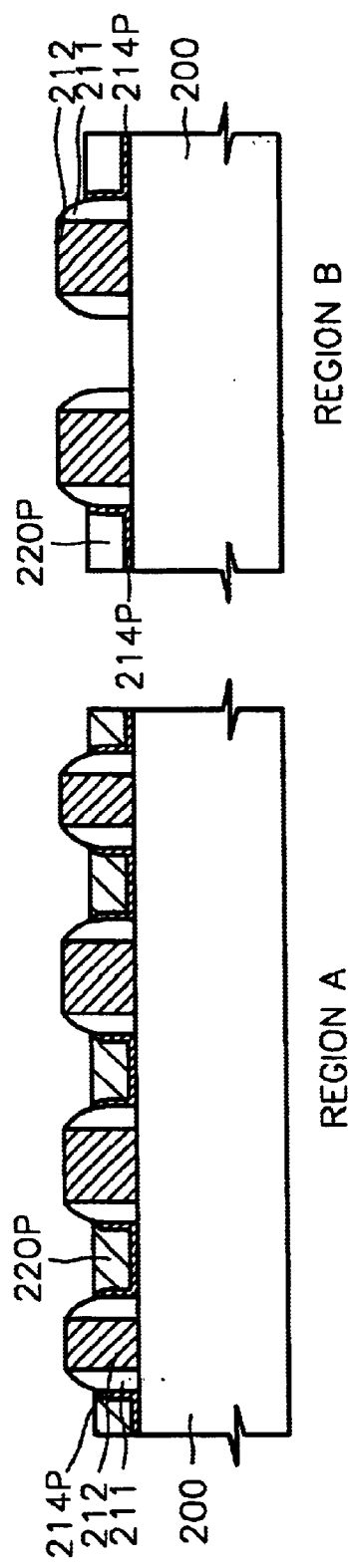

METHOD OF FORMING A PATTERN USING A PHOTORESIST WITHOUT EXPOSING THE PHOTORESIST AND SILICIDATION METHOD INCORPORATING THE SAME

BACKGROUND OF THE INVENTION

1. Field of the Invention

The present invention relates to a method of forming a pattern in the manufacturing of a semiconductor device. More particularly, the present invention relates to a method of using photoresist to form an electronics pattern of a semiconductor device.

2. Description of the Related Art

When manufacturing a DRAM, in order to minimize gate resistance and attain the optimum refresh time it is necessary to selectively silicidate the gates. In this case, the silicide layer should not be formed on the active area.

Lately, a merged DRAM with logic (MDL) has been recognized for its high performance and small chip size. When manufacturing an MDL, silicide is formed on both an active area and on gates, or on parts of the active area and gates in a peripheral circuit and logic portion of the MDL, in order to reduce contact resistance or sheet resistance of the gates and source/drain. On the other hand, the silicide is selectively formed on the gates of a memory cell array portion in order to attain the optimum refresh time.

In the case of manufacturing a SRAM, suicide is selectively formed on the active area and on all of the gates in order to attain a high-speed operation.

In the case of an NVM, the greater the pattern density, the longer the gate must be. Therefore, silicide has only recently begun being selectively formed on the gates of NVMs in order to reduce resistance.

Techniques of silicidating a selected area in the manufacturing of a semiconductor device is disclosed in Korean Patent Laid-Open Publication No. 2000-000885 and Japanese Patent Laid-Open Publication No. Hei 11-163326.

The technique disclosed in Korean Patent Laid-Open Publication No. 2000-000885 will be described with reference to the flow chart of FIG. 1 and the sectional views of FIGS. 2 through 8.

First, a plurality of gates 12 including side wall spacers 11 are formed on a substrate 10. Then, a target layer to be patterned, for example, a silicidation blocking dielectric layer 14, is formed over the entire surface of the substrate 10, and an anti-reflection layer 16 is formed on the silicidation blocking dielectric layer 14 (step 1), as shown in FIG. 2. Next, in step 2, a photoresist coating 20 is formed on the anti-reflection layer 16, as shown in FIG. 3. In step 3 and as shown in FIG. 4, an exposure process is performed using a mask 30 having a transmission area corresponding to an upper portion of the gates 12 that are to be subjected to silicidation. In step 4 and as shown in FIG. 5, the exposed portion of the photoresist 20 is removed using a general developing solution, whereby a photoresist pattern 20P is formed. The photoresist pattern 20P exposes areas directly above the gates 12. In step 5, portions of the anti-reflection layer 16 and the silicidation blocking dielectric layer 14 are removed using the photoresist pattern 20P as an etching mask, whereupon the upper portions of the gates 12 are exposed as shown in FIG. 6. Then, in step 6, the photoresist pattern 20P and the remainder of the anti-reflection layer 16 are removed, as shown in FIG. 7. Finally, in step 7, a silicidation process is performed in which a silicide layer 40 is formed on the upper portion of the gates 12, as shown in FIG. 8.

However, this prior art process is complicated because it requires the forming of the anti-reflection layer 16 to prevent irregular reflection at the surface of the silicidation blocking dielectric layer 14, and the removing of the anti-reflection layer 16 after the patterning process. Also, the smaller the gates 12 and the greater their density, the more likely a misalignment error will occur during the exposure process. When such a misalignment error occurs, the silicide layer is not formed locally on the upper portion of the gates 12 or an undesirable silicide layer is formed locally on an active area.

Also, according to the prior art method disclosed in Korean Patent Laid-Open Publication No. 2000-000885, the entire surface of the substrate is coated with undoped silicate glass (USG). Subsequently, the USG layer is etched back using a microloading effect. As a result, the USG layer remains in the memory cell array portion where the gate patterns are dense, whereas the USG layer is almost etched in the peripheral circuit and logic portion where gate patterns are sparse. However, when the USG layer is etched back, the remaining USG layer is not uniform, and the selectivity of the process to an etch-back stopper of a lower portion of the USG layer and the silicidation blocking dielectric layer is low. Therefore, the process is marked by poor stability and reproducibility. Also, it becomes impossible to achieve partial silicidation of the peripheral circuit and logic portion.

Japanese Patent Laid-Open Publication No. Hei 11-163326 discloses methods of forming a semiconductor device having a memory cell array portion (region A) and a logic portion (region B). In one embodiment, as shown in FIG. 9, a silicidation blocking dielectric layer 14 and photoresist 20 are sequentially formed over the entire surface of a substrate 10 on which gates 12 and gate side wall spacers 11 have been formed. Next, as shown in FIG. 10, the photoresist 20 in the peripheral circuit and logic portion (region B) is exposed using a mask 35. The exposed photoresist 20 is developed to form a photoresist pattern 20P that covers the memory cell array portion (region A) and exposes the peripheral circuit and logic portion (region B), as shown in FIG. 11. The photoresist pattern 20P is etched back to form a secondary photoresist pattern 20P' that exposes an upper portion of gate patterns in the memory cell array portion (region A), as shown in FIG. 12. Next, the blocking dielectric layer 14 is etched using the secondary photoresist pattern 20P' as an etching mask to form a blocking dielectric layer pattern 14P. At this stage of the method, an active area of the peripheral circuit and logic portion (region B) and an upper portion of gates 12 in the memory cell array portion (region A) are exposed, as shown in FIG. 13. Subsequently, the secondary photoresist pattern 20P' is removed, as shown in FIG. 14, and a silicidation process is performed such that a silicide layer 40 is formed on the upper portion of the gates 12 in the memory cell array portion (region A), on the upper portion of the gates 12 in the peripheral circuit and logic portion (region B), and on the active area of the peripheral circuit and logic portion (region B), as shown in FIG. 15.

However, this method is also complicated because of the numerous steps required, including the steps of forming a silicidation blocking dielectric layer, forming a photoresist layer, exposing the photoresist layer, developing the photoresist layer (forming a photoresist pattern), etching back the photoresist pattern, etching the blocking dielectric layer, removing the photoresist pattern, and performing silicidation. Also, it is difficult to provide a high degree of selectivity in the etch back of the photoresist pattern with respect to the blocking dielectric layer. In the case of low selectivity, the upper portion of the gates are exposed. Moreover, the etch-back process does not produce a high degree of uniformity.

SUMMARY OF THE INVENTION

Therefore, an object of the present invention is to overcome the disadvantages and limitations of the prior art.

More specifically, one object of the present invention is to provide a relatively simple method of forming a pattern in the manufacturing of a semiconductor device, which is not limited by the design rule of the device.

Another object of the present invention is to provide a relatively simple silicidation method which facilitates the selective silicidation of an area(s) on a substrate and that is economical to carry out.

It is yet another object of the present invention to provide a method of forming a photoresist pattern without using an exposure process, thereby obviating the misalignment errors that would otherwise become more likely to occur the smaller the design rule becomes.

The method of forming a pattern without using an exposure process comprises steps of forming a target layer to be patterned on a substrate having a pattern that defines a step, forming a photoresist layer on the target layer, forming a photoresist pattern by treating the photoresist layer with a developing solution to thereby form a photoresist pattern having a height smaller than that of the step, removing the target layer exposed by the photoresist pattern to thereby form a predetermined pattern, and removing the photoresist pattern.

The treating of the photoresist layer with the developing solution is preferably carried out until the height of the photoresist pattern is preferably 20–90% of the height of the step.

The photoresist layer is preferably formed of photoresist including a first novolak resin and a photoactive compound of 3–15 wt % based on the total weight of the first novolak resin, photoresist including a first novolak resin, a second novolak resin of 10–60 wt % based on the total weight of the first novolak resin and having a rate of dissolution in the developing solution of 300–1500 Å/sec, and a photoactive compound of 15–30 wt % based on the total weight of the first novolak resin, or photoresist including a first novolak resin, polyhydroxystyrene of 10–60 wt % based on the total weight of the first novolak resin, and a photoactive compound of 15–30 wt % based on the total weight of the first novolak resin.

Preferably, the substrate on which the photoresist layer has been formed is baked before the developing step.

The photoresist layer may also be formed of photoresist including a polymer, in which a t-butyloxycarbonyl group and an acetal group are combined with a backbone of the polymer as a protecting group, and a photoacid generator of 0.5–8 wt % based on the total weight of the polymer. in this case, the baking of the substrate preferably comprises first baking the substrate at a temperature of 90–120° C. for 30–120 seconds, and secondly baking the substrate at a temperature of 130–160° C. for 30–120 seconds.

The silicidation process for selectively silicidating an area(s) on a substrate incorporates the method of forming a pattern.

Specifically, the silicidation process of the present invention is particularly well-suited to the manufacturing of MDLs in which the substrate has a memory portion and a peripheral circuit and logic portion at the periphery of the memory portion.

In this case, a target layer, as a silicidation blocking layer, is formed on the gate patterns of the peripheral circuit and logic portion and the memory portion of the substrate. A photoresist layer is formed on the target layer at both the memory portion and peripheral circuit and logic portion of the substrate such that the upper surface of the photoresist layer is situated above the target layer.

Then, only photoresist that is located at the peripheral circuit and logic portion is exposed.

Next, a portion of the photoresist layer located over a first area at the memory portion of the substrate is dissolved, and all of the photoresist layer that has been exposed at the peripheral circuit and logic region is dissolved, by soaking the photoresist layer in a developing solution. The resulting photoresist pattern exposes part of the target layer at the memory portion and exposes at least part of the target layer on both the gate pattern and an active area of the peripheral circuit and logic portion.

Next, the exposed parts of the target layer at both the memory portion and peripheral circuit and logic portion of the substrate are removed, followed by the removal of the photoresist pattern. Subsequently a silicide layer is formed on the upper portion of the gate pattern of the memory portion, and in an active area and on the upper portion of the gate pattern of the peripheral circuit and logic portion of the substrate.

BRIEF DESCRIPTION OF THE DRAWINGS

The above and other objects, features and advantages of the present invention will become more apparent from the following detailed description of the preferred embodiments thereof made with reference to the attached drawings of which:

FIGS. 9 through 15 are sectional views of a semiconductor substrate illustrating the sequence of steps performed on the substrate according to another prior art method;

FIGS. 22 through 27 are sectional views of a semiconductor substrate illustrating a preferred embodiment of a silicidation method according to the present invention, as applied to the manufacturing of a merged DRAM with logic (MDL);

FIGS. 28 through 32 are sectional views of a semiconductor substrate illustrating the silicidation method according the present invention as applied, to the manufacturing of another form of an MDL;

DETAILED DESCRIPTION OF THE PREFERRED EMBODIMENTS

Figure 1:
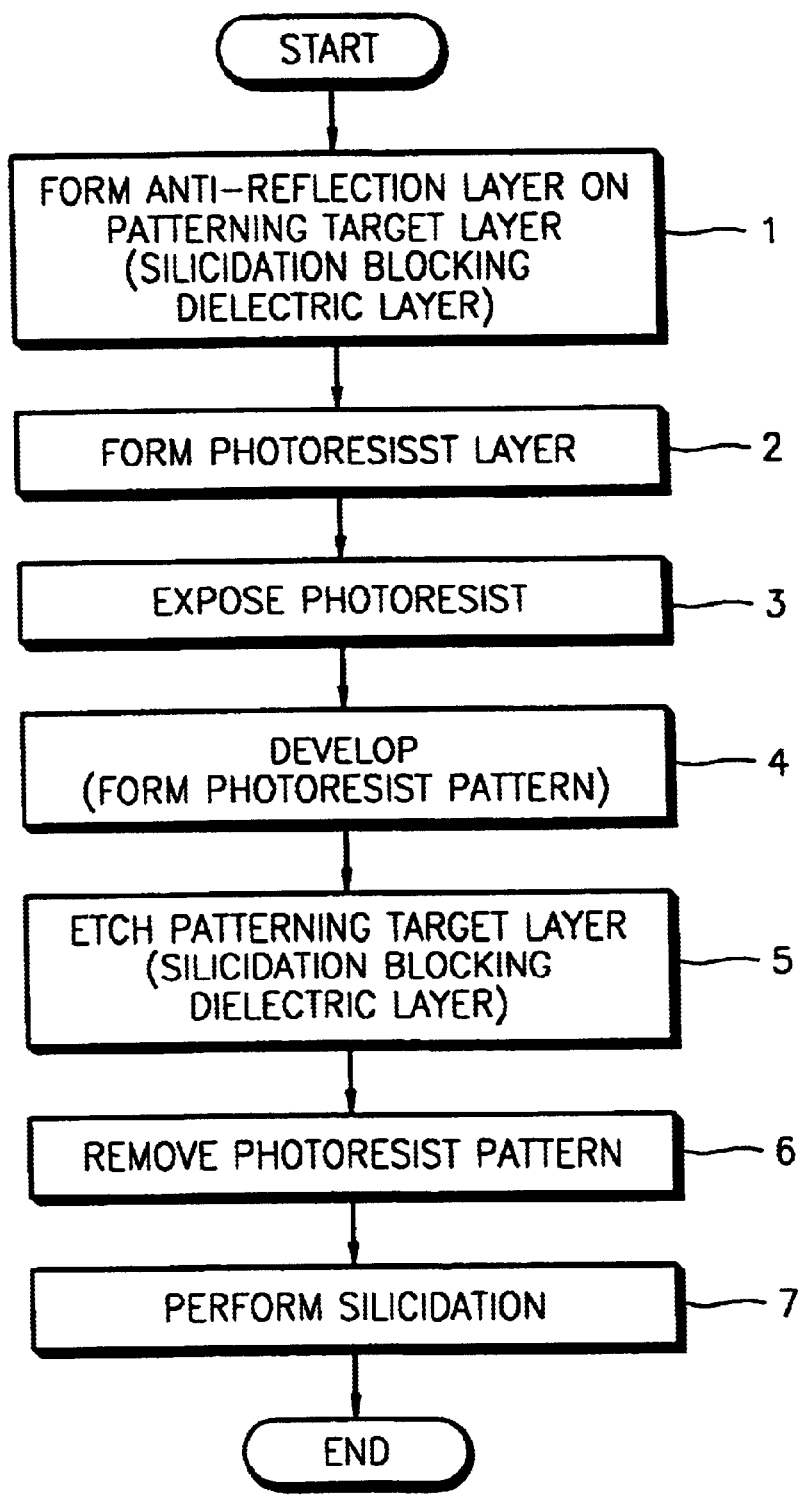
FIG. 1 is a flow chart of a conventional method of forming a pattern and a silicidation process incorporating the same.
Figure 2:
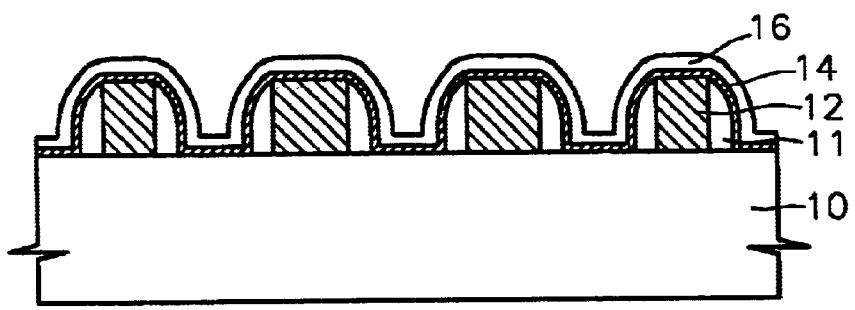
FIGS. 2 through 8 are sectional views of a semiconductor substrate illustrating the sequence of steps performed on the substrate according to the method outlined in FIG. 1.
Figure 3:
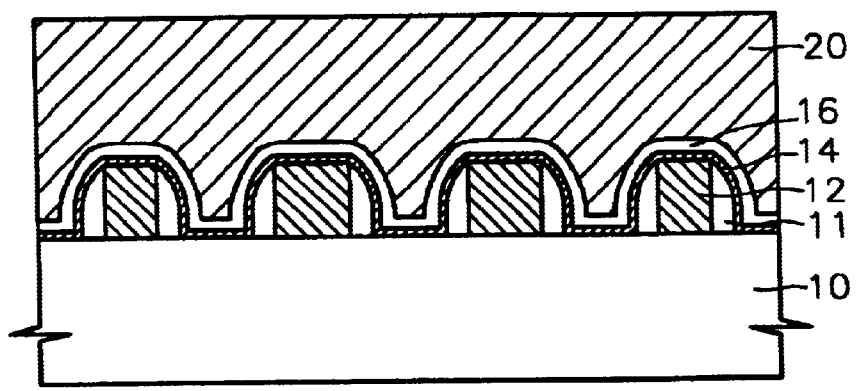
Figure 4:
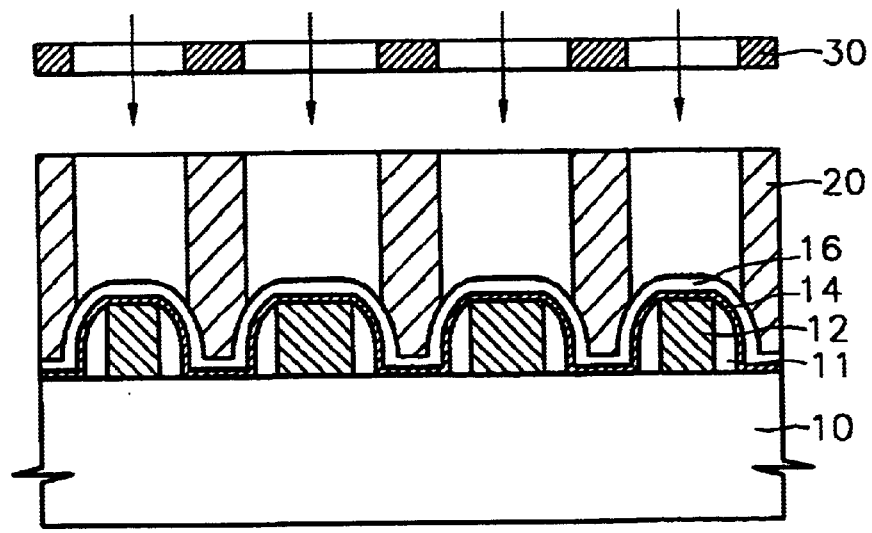
Figure 5:
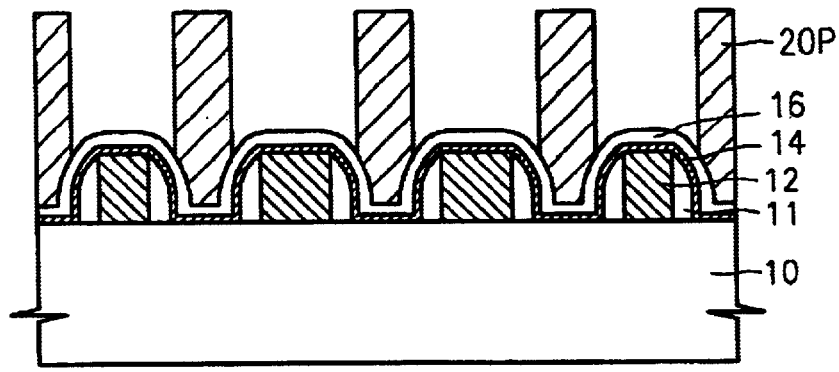
Figure 6:
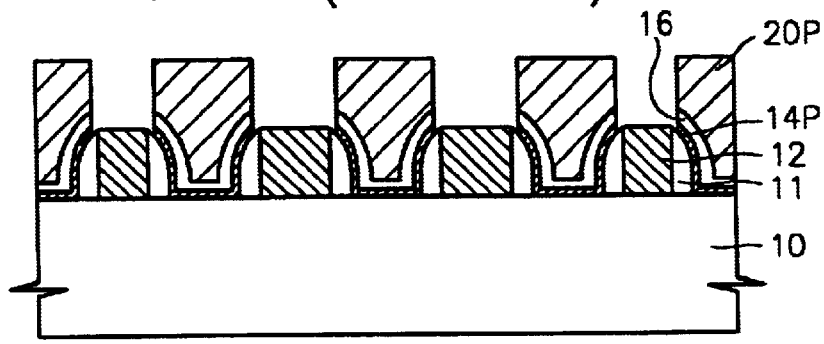
Figure 7:
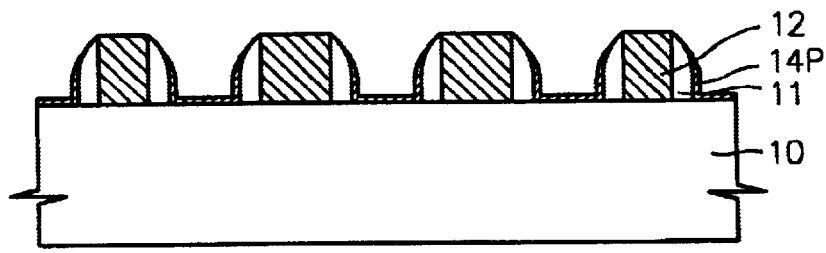
Figure 8:
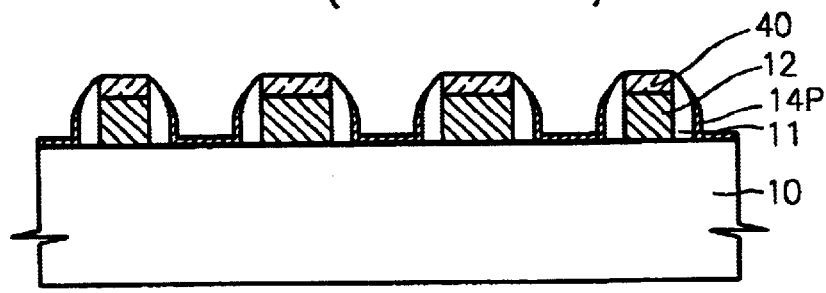
Figure 9:
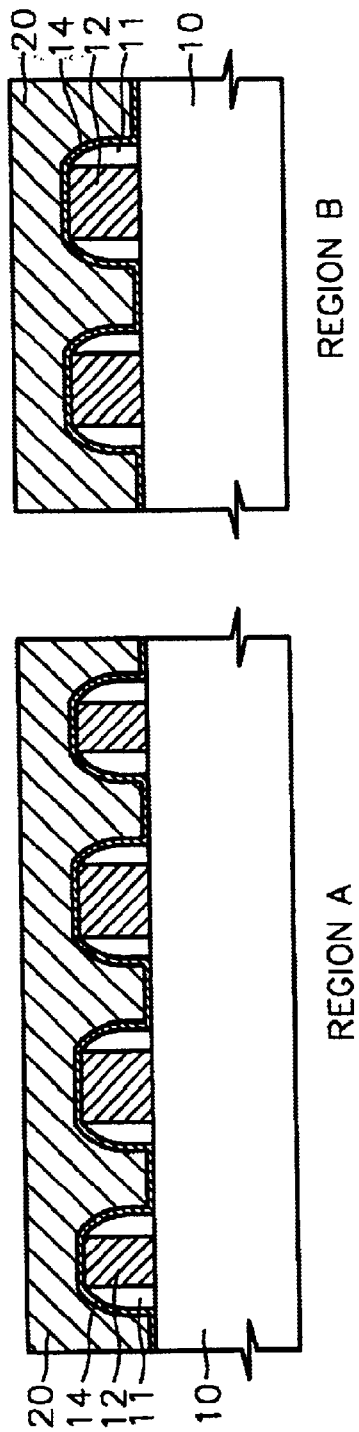
Figure 10:
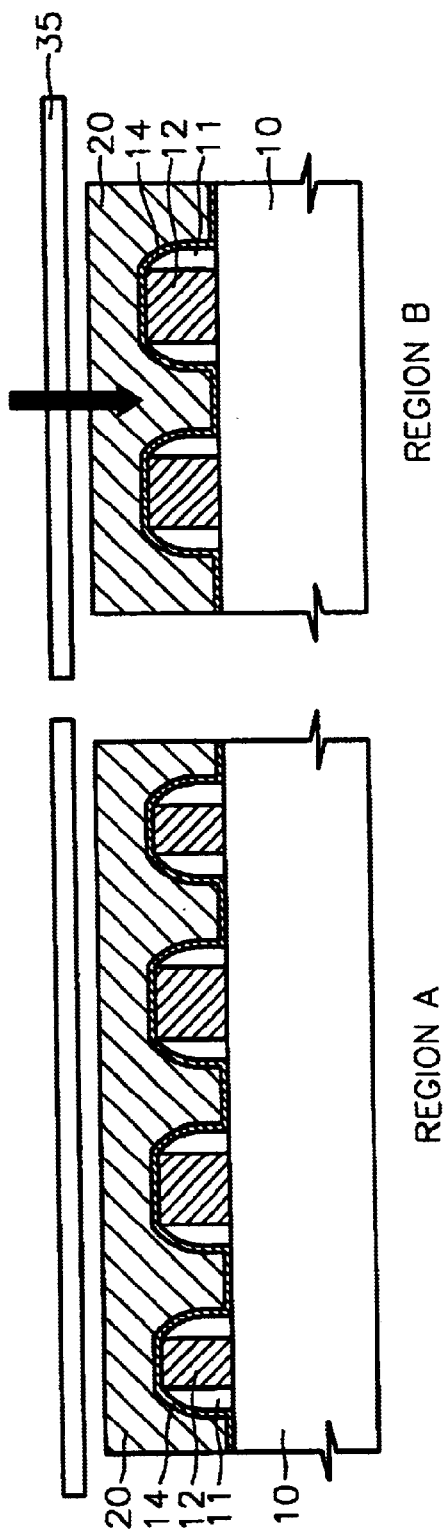
Figure 15:
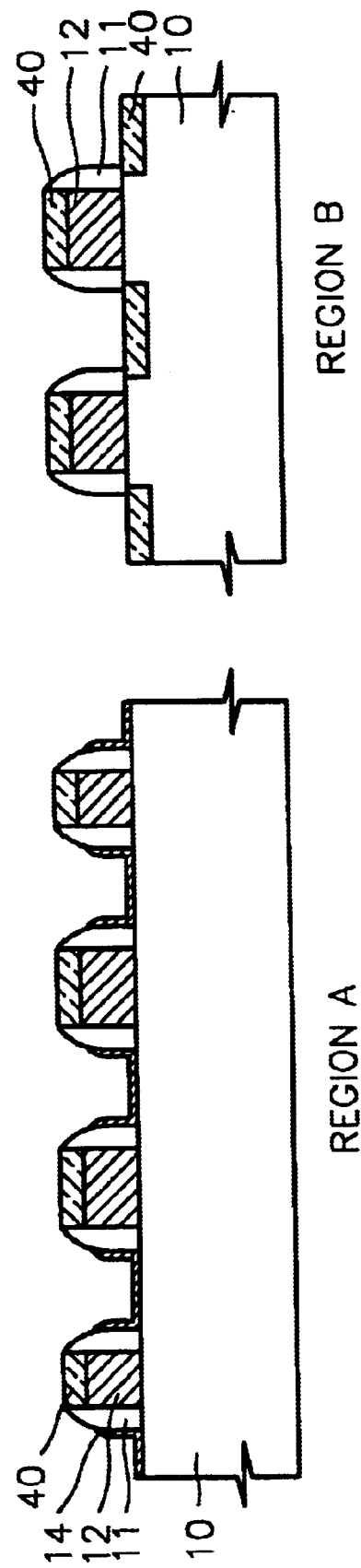
Figure 16:
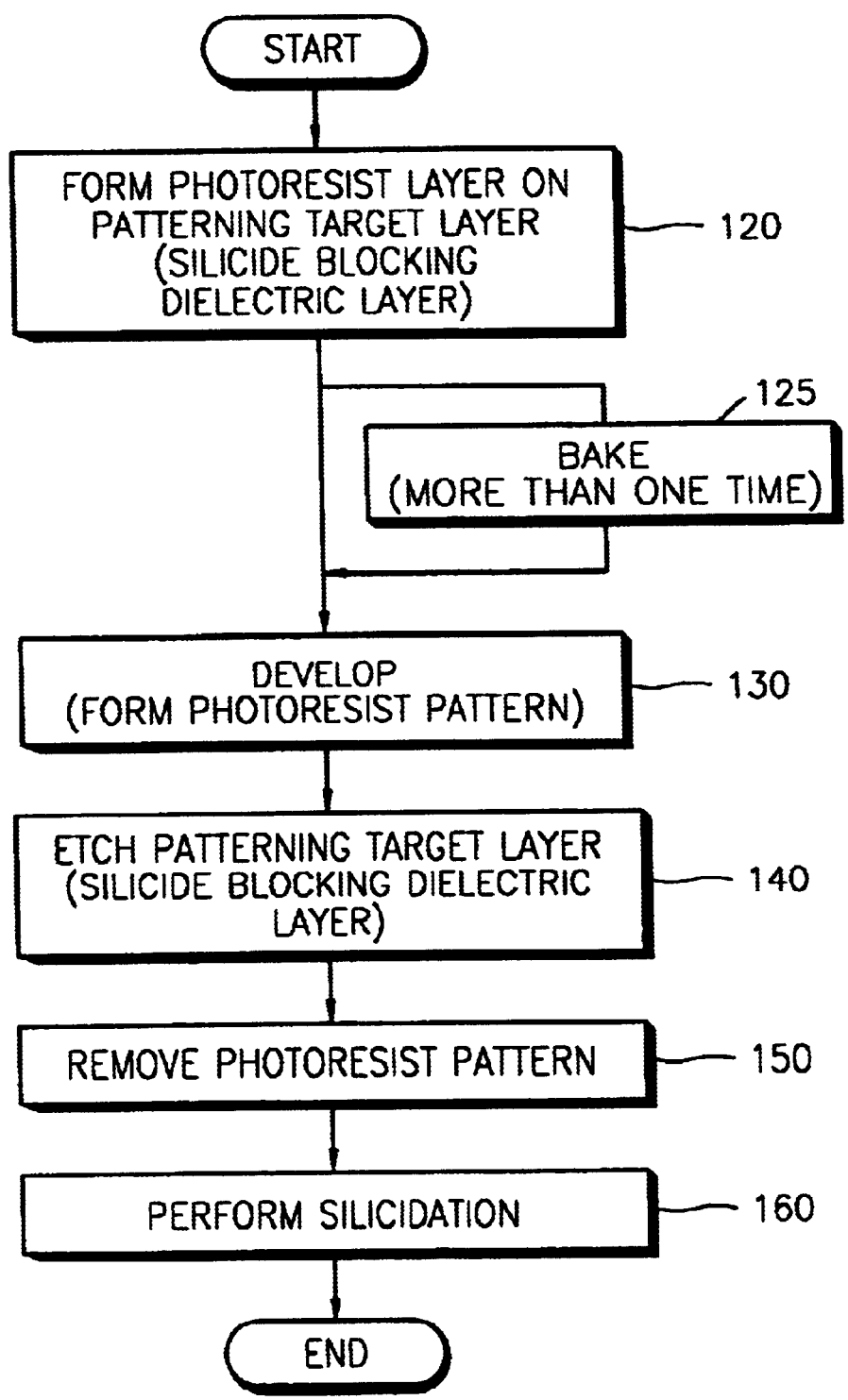
FIG. 16 is a flow chart of a first preferred embodiment of a method of forming a pattern, and of a silicidation process incorporating the same, according to the present invention.

A first method of forming a pattern in the manufacturing of a semiconductor device, and a silicidation process embodying the same will now be described with reference to the flow chart of FIG. 16 and the sectional views of FIGS. 17 through 21.

First, a basic structure is formed as follows. A target layer is conformably formed on a (stepped surface) pattern, and a photoresist layer is formed on the target layer. Such a stepped surface pattern may be constituted by line and space patterns. The method according to the present invention will be described using a gate pattern as an example of the stepped pattern targeted for silicidation.

Figure 17:
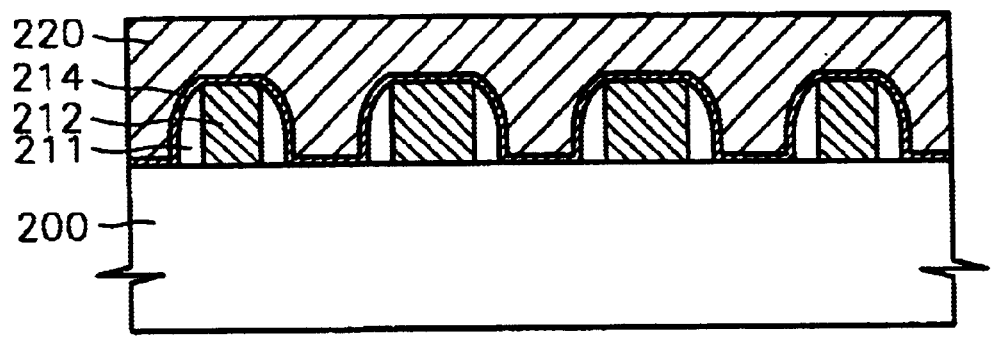
FIGS. 17 through 21 are sectional views of a semiconductor substrate illustrating the sequence of steps performed on the substrate according to the first preferred embodiment of the method present invention.

More specifically, as shown in FIG. 17 (step 120), a target layer 214 is formed on a substrate 200 on which gates 212 including side wall spacers 211 are disposed. The target layer 214 is formed of a dielectric that can block a silicidation process. Preferably, the target layer 214 is a nitride layer (SiN), an oxynitride layer (SiON) or a middle temperature oxide layer having a thickness of 50–500 Å. Subsequently, a photoresist layer 220 is formed on the target layer 214.

Figure 18:
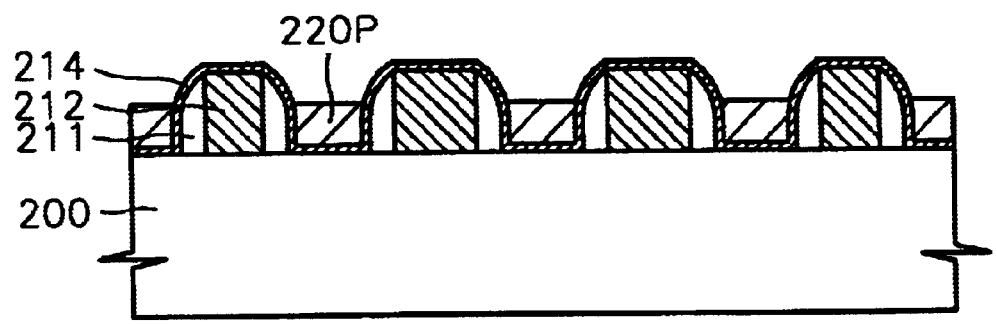

Next, in step 130, the photoresist layer 220 is treated with a developing solution. In this way, the photoresist is removed until the upper surface thereof is situated below the upper portion of the gates 212, as shown in FIG. 18. That is, the resulting photoresist pattern 220P exposes the upper portion of the patterns made up of the sidewall spacers 211, gates 212 and target layer 214. In this step, the height of the photoresist pattern 220P is 20–90% that of the gates 212 so that the photoresist pattern 220P is suitable for use as a mask during the following etching process. For example, when the height of the gates 212 is 3000 Å, the height of the photoresist pattern 220P is preferably 600–2700 Å. The final height of the photoresist pattern 220P is established by the etching selectivity of the target layer 214 with respect to the lower portion gates 212, and the side wall spacers 211.

The photoresist pattern 220P can be formed by a developing process, without being exposed, because the photoresist that is used has a residual layer proportion characteristic of less than 80%, preferably, 20–80%, and more preferably, 20–50%. The residual layer proportion characteristic is the value obtained by dividing the thickness of the photoresist pattern 220P (the thickness of the photoresist after being treated with developing solution) by the thickness of the photoresist layer 220 (the thickness of the photoresist before being treated with developing solution) and then multiplying by 100%. Photoresist comprising a first novolak resin, and photoactive compound (PAC) of 3–15 wt % based on the total weight of the first novolak resin, can exhibit a residual layer proportion characteristic within the above-described ranges.

In particular, the first novolak resin should have a developing rate of 500–1000 Å/sec. Also, the novolak resin preferably has an average molecular weight of 2000–10000 g/mole and a polydispersity of 2.0–7.0.

Such a novolak resin can be manufactured by condensing a cresol mixture of m-cresol and p-cresol with formalin in the presence of an oxalic acid catalyst, or by condensing o-cresol, m-cresol, p-cresol, and 2, 4-xylenol with formalin in the presence of an oxalic acid catalyst. A quinonediazid group compound is used as the photoactive compound.

Alternatively, the photoresist may comprise the first novolak resin, a second novolak resin of 10–60 wt % based on the total weight of the first novolak resin and having a rate of dissolution of 300–1500 Å/sec in a developing solution, and a photoactive compound of 15–30 wt % based on the total weight of the first novolak resin; the photoresist may comprise the first novolak resin, polyhydroxystyrene of 10–60 wt % based on the total weight of the first novolak resin, and a photoactive compound of 15–30 wt % based on the total weight of the first novolak resin; or the photoresist may comprise a compound of these photoresist compositions.

The second novolak resin preferably has an average molecular weight of 2000–10000 g/mole and a polydispersity of 3.0–7.0. On the other hand, the polyhydroxystyrene preferably has an average molecular weight of 3000–50000 g/mole and a polydispersity of 1.1–3.0.

As an option, the substrate 200 can be baked (step 125) before the photoresist 220 is treated with any of the above-described developing solutions, i.e., before step 130. Baking the photoresist layer 220 increases its solubility in a developing solution. Therefore, the baking of the photoresist layer 220 can ensure that its residual layer proportion characteristic is less than 80%, and is even as low as below 50%.

The baking step 125 is preferable, according to the method of the present invention, especially when the photoresist layer 220 is formed of photoresist that includes a polymer having protecting groups combined with a backbone. An example of such a photoresist is one that includes a polymer having a t-butyloxycarbonyl group and an acetal group combined with a backbone of the polymer and a photoacid generator of 0.5–8 wt % based on the total weight of the polymer. However, protecting groups other than those of the t-butyloxycarbonyl group and the acetal group can be used. In any case, the efficacy of the protecting groups is reduced by heat. Therefore, baking the photoresist layer 220 increases the solubility thereof in the developing solution, whereby the desired residual layer proportion characteristic can be attained. In fact, after the above-described photoresist is baked, its residual layer proportion characteristic can be as low as less than 80%, and even as low as 20–50%.

In this embodiment, the photoresist layer 220 is preferable formed of photoresist comprising a polymer that includes a protecting group of 3–10 wt % based on the total weight of the polymer backbone, the polymer backbone being polyhydroxy phenol or novolak. Furthermore, the photoresist preferably has an average molecular weight of 3000–20000 g/mole and a polydispersity of 1.3–3.5.

The baking step 125 can be performed as a single stage process by baking the photoresist layer 220 at a temperature of 130–160° C. for 30–120 seconds. Alternatively, the baking step 125 can be performed in two stages, namely a first stage of baking the photoresist layer 220 at a temperature of 90–120° C. for 30–120 seconds and a second stage of baking the photoresist layer 220 at a temperature of 130–160° C. for 30–120 seconds. The two-stage baking process is advantageous when the backbone of the polymer of the photoresist is combined with two or more different protecting groups. In that case, the efficacy of the different protecting groups can be reduced during the different stages of the baking process, respectively, whereby the desired residual layer proportion characteristic of the photoresist layer 220 can be easily attained.

The developing step 130 is performed by treating (flushing) the photoresist layer 220 with TMAH of 2.38 wt % for 20–150 seconds, by treating (flushing) the photoresist layer 220 with NaOH or KOH for 20–200 seconds, by treating (flushing) the photoresist layer 220 with methanol or ethanol for 10–200 seconds, or by treating (flushing) the photoresist layer 220 with choline for 20–200 seconds.

Figure 19:
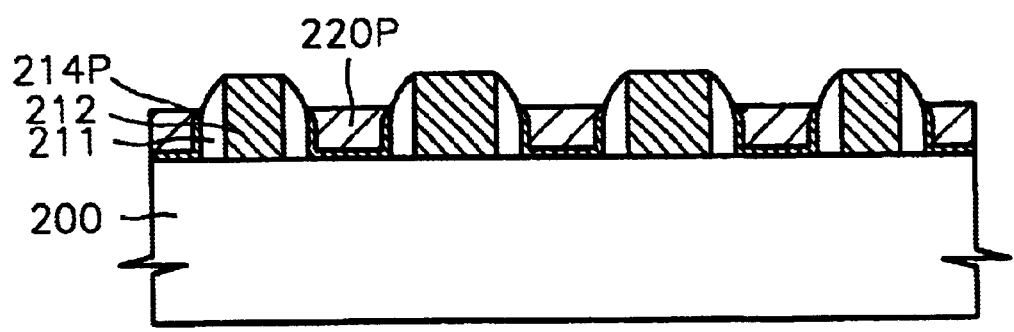
Figure 20:
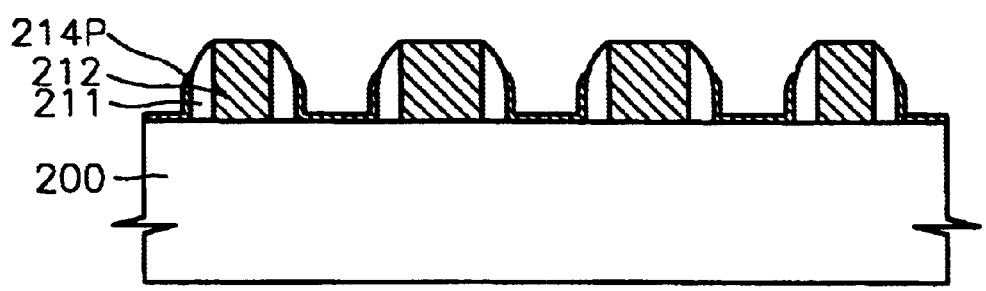
Figure 21:
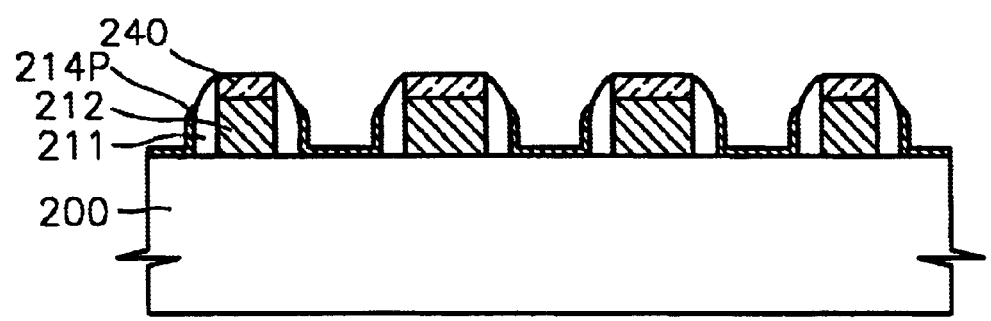

Next, in step 140, the portion of the target layer 214 that is left exposed by the photoresist pattern 220P is etched. As a result, a silicidation blocking dielectric layer pattern 214P is formed, leaving the upper portion of the gates 212 exposed, as shown in FIG. 19. The photoresist pattern 220P is then removed in step 150, as shown in FIG. 20. Finally, a heat-resistant metal such as cobalt, titanium, or tungsten is deposited on the resultant structure, and a quick thermal treatment is performed to form a silicide layer 240 on the upper portion of the exposed gates 212. The unreacted metal is removed, and the silicide reaction is completed in step 160, as shown in FIG. 21.

Accordingly, the first preferred embodiment of the present invention can be used to manufacture a DRAM, an NVM, or an SRAM, in which only the upper portion of the gates is to be silicidated.

A second preferred embodiment of the present invention will now be described with reference to the manufacturing of an MDL device as shown in FIGS. 22 through 27. As was described previously, the active area and the upper portion of the gates are all silicidated in the peripheral circuit and logic portion (region B) of an MDL device, but only the upper portion of the gates is silicidated in the memory cell array portion (region A) of the device.

Figure 22:
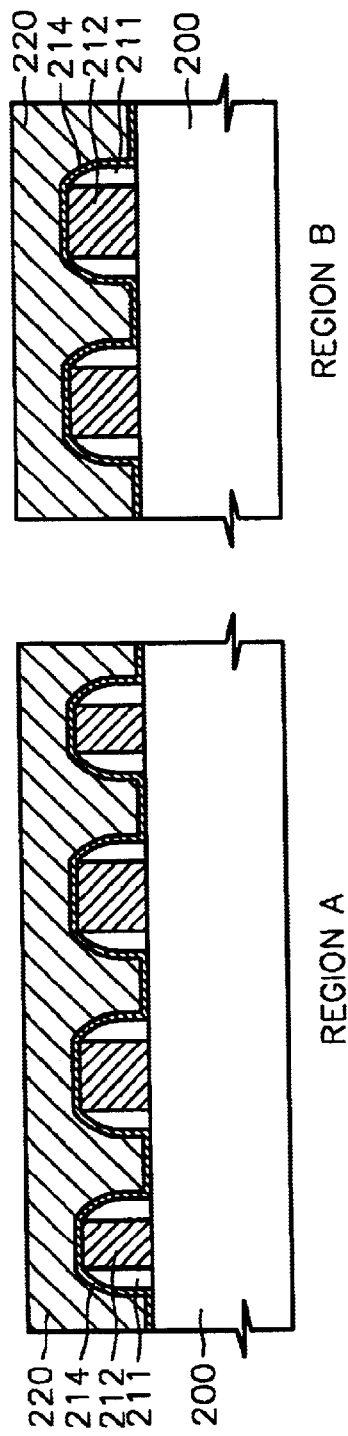

Referring now to FIG. 22, side wall spacers 211, gates 212, and the target layer 214 are sequentially formed on the substrate 200 in both the memory cell array portion (region A) and the peripheral circuit and logic portion (region B). Next, the photoresist layer 220 is formed using the same photoresist as described in connection with the first preferred embodiment.

Figure 23:
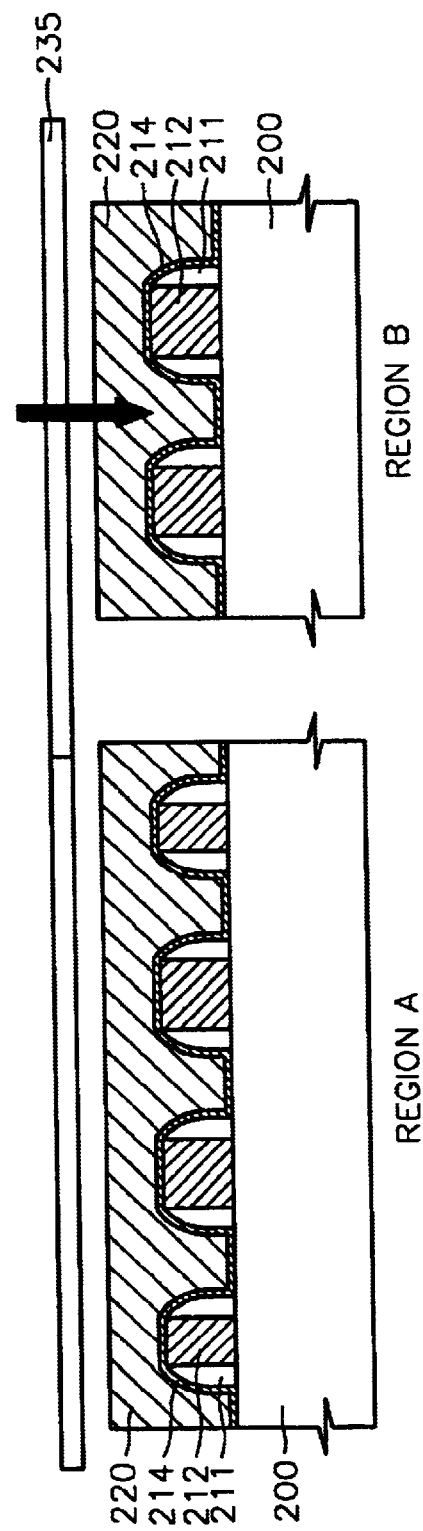

Next, as shown in FIG. 23, the peripheral circuit and logic portion (region B) is exposed using a mask 235. That is, the mask 235 has a transmission area corresponding only to the peripheral circuit and logic portion (region B).

Figure 24:
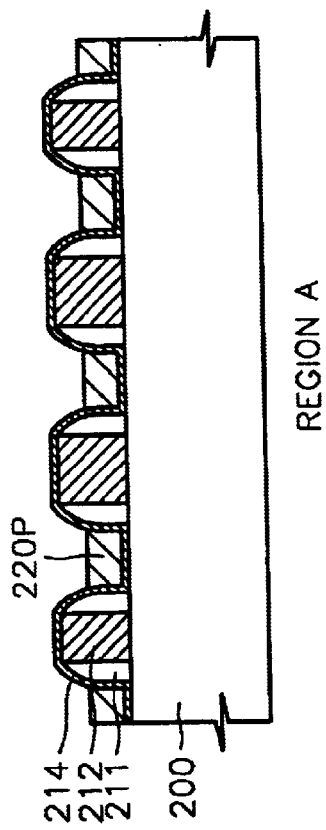

Subsequently, a developing step is performed in the same way as described in connection with the first preferred embodiment. Of course, a baking step can be incorporated before the developing process, as also described in connection with the first preferred embodiment. As a result, as shown in FIG. 24, the entire surface of the peripheral circuit and logic portion (region B) is exposed, whereas a photoresist pattern 220P remains in the memory cell array portion (region A) to expose only the upper portion of the gates 212 of the memory cell array portion (region A).

That is, the photoresist layer 220 is removed entirely from the peripheral circuit and logic portion (region B) by the developing solution due to its having been exposed prior to the developing step. On the other hand, the photoresist layer 220 is not exposed in the memory cell array portion (region A) prior to the developing step. Treating the photoresist layer 220 with developing solution in the memory cell array portion (region A) results in only a portion of the photoresist being removed because the residual layer proportion characteristic of the photoresist layer 220 is less than 80%, and preferably, less than 50%. Thus, a photoresist pattern 220P remains in the peripheral circuit and logic portion (region B) to expose the upper portion of the gates 212 of the memory cell array portion (region A). Hence, an anti-reflection layer is not required. Thus, this method of the present invention is simpler than the conventional method in which the photoresist pattern of the memory cell array portion is etched back to expose the upper portion of the gates after the photoresist pattern is formed to expose only the peripheral circuit and logic portion (region B). Also, other problems caused by etch back are obviated by the present invention.

Figure 25:
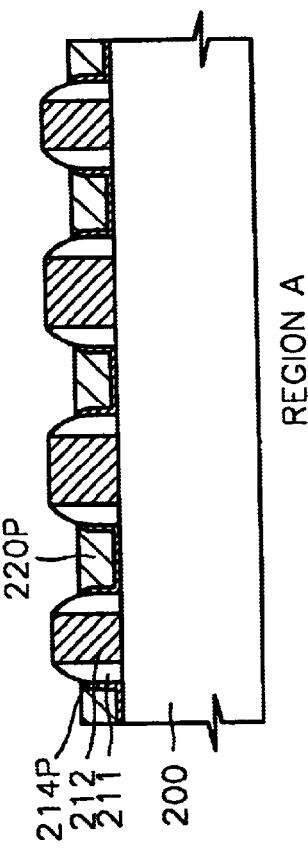

Next, the target layer 214 is etched using the photoresist pattern 220P as an etching mask to form a silicidation blocking dielectric layer pattern 214P, as shown in FIG. 25. Then the photoresist pattern 220P is removed, as shown in FIG. 26. Subsequently, a silicide layer 240 is formed at the upper portion of the gates 212 of the memory cell array portion (region A) using the silicidation blocking dielectric layer pattern 214P, and on both the active area and the upper portion of the gates 212 of the peripheral circuit and logic portion (region B), as shown in FIG. 27. These steps are basically performed in the same way as described in connection with the first preferred embodiment.

A third preferred embodiment of the present invention, which is applied to the manufacturing of an MDL device, will now be described with reference to FIGS. 28 through 33. In this MDL device, only the active area and a predetermined part of the upper portion of the gates are silicidated in the peripheral circuit and logic portion (region B), and only the upper portion of the gates is silicidated in the memory cell array portion (region A).

Figure 28:
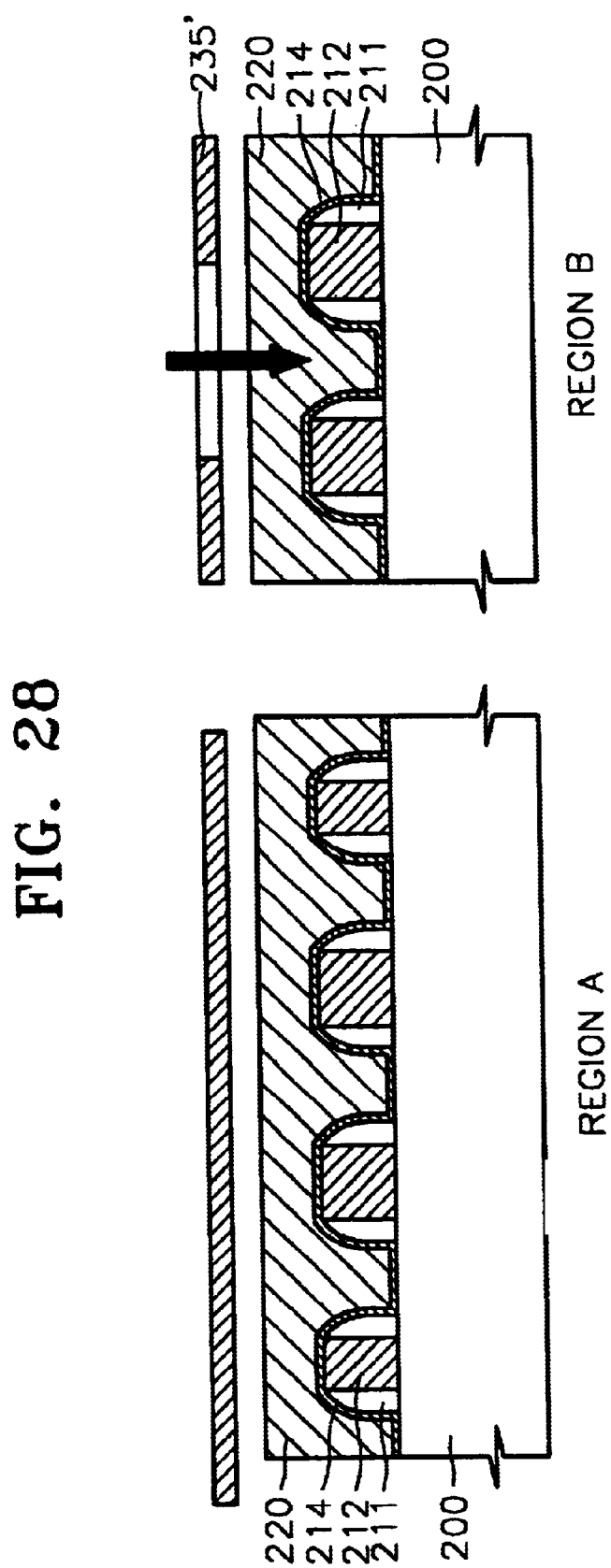

Referring to FIG. 28, the same processes of the first preferred embodiment up to and including the forming of the photoresist layer 220 are used. Next, an exposure process is performed using a mask 235' having a transmission area corresponding to the active area and a predetermined segment of the upper portion of the gates in the peripheral circuit and logic portion (region B). A developing process follows in the same way as described in connection with the first preferred embodiment. As a result, as illustrated in FIG. 29, a photoresist pattern 220P is formed that exposes the area of the peripheral circuit and logic portion (region B) that had been exposed by the mask 235', and that exposes the upper portion of the gates 212 of the memory cell array portion (region A).

That is, according to the third preferred embodiment, the peripheral circuit portion and the logic portion (region B) is partially exposed and, at the same time, only the upper portion of the gates 212 of the memory cell array portion (region A) is exposed.

Figure 31:
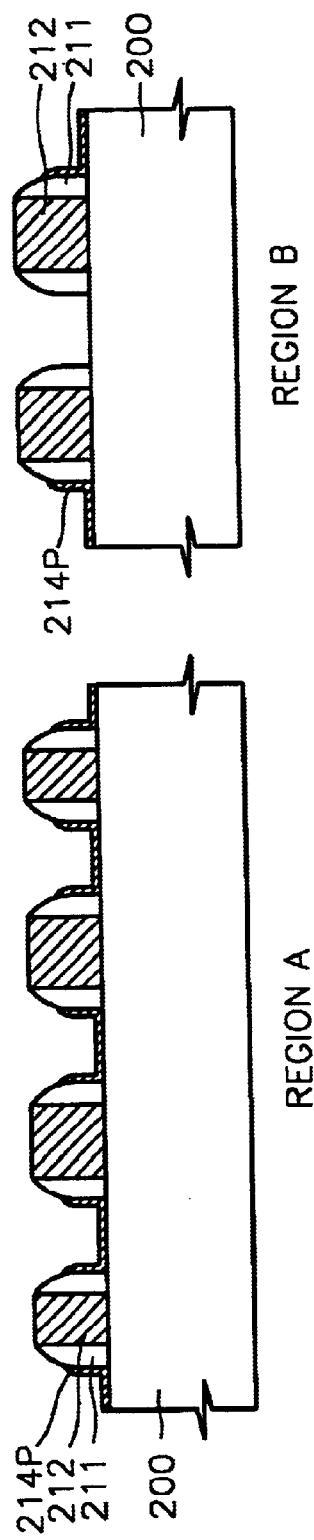
Figure 32:
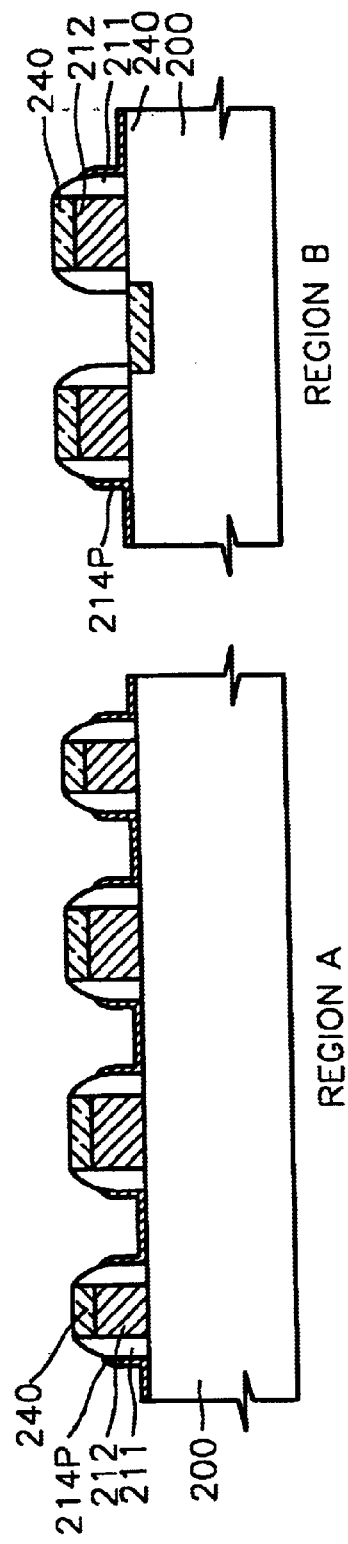

After that, the target layer 214 is etched using the photoresist pattern 220P as an etching mask to form a silicidation blocking dielectric layer pattern 214P, as shown in FIG. 30. The photoresist pattern 220P is then removed, as shown in FIG. 31. Finally, a silicide layer 240 is formed on the upper portion of the gates of the memory cell array portion (region A), and on part of the peripheral circuit and logic portion (region B) using the silicidation blocking dielectric layer pattern 214P as a mask. Again, these steps are performed in basically the same manner as those described in connection with the first preferred embodiment.

The third preferred embodiment is advantageous in that the peripheral circuit and logic portion (region B) can be partially silicidated.

Next, examples of the present invention will be described to more fully illustrate the features and advantages of the present invention. However, the present invention should not be construed as being limited to these examples.

EXAMPLE 1

Dependence Between the Residual Layer Proportion Characteristic and the Content of Photoactive Compound A phenol novolak resin was made by condensing a cresol compound, in which m-cresol and p-cresol are mixed at a ratio of 30:70, with formalin under an oxalic acid catalyst. The phenol novolak resin was dissolved with a photoactive compound in propylene glycol monoethyl acetate (PGMEA) to produce the photoresist. The photoactive compound was manufactured by reacting 1,2-naphthoquinone-2-diazide-5-sulfonylchloride and 1,1,1-tri(4-hydroxyphenyl)ethane with 1,4-dioxane under a triethylamine catalyst.

Here, five batches of photoresist having respective different photoactive compound weight ratios of 7 wt %, 11 wt %, 16 wt %, 19 wt %, and 22 wt % to the total weight were prepared.

Four substrates were coated to a thickness of 6000 Å with the photoresist having the photoactive compound weight ratio of 7 wt %. The substrates were soaked in a TMAH developing solution of 2.38 wt % for 20 seconds, 40 seconds, 60 seconds, and 80 seconds, respectively, and then the thickness of the remaining photoresist layer was measured. Experiments were conducted on the photoresists having the other weight ratios of the photoactive compound, under the same experimental conditions. The results are illustrated in FIG. 33.

Figure 33:
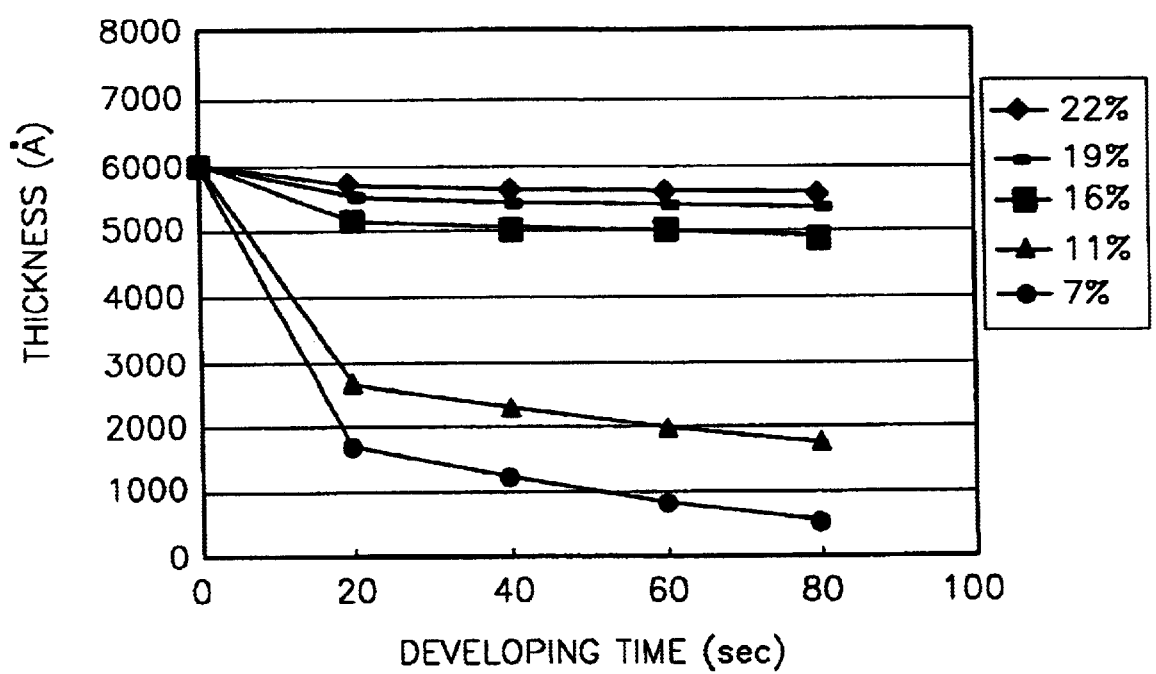
FIG. 33 is a graph illustrating a relationship between the residual layer proportion characteristic of a photoresist, the content of photoactive compound of the photoresist, and the developing time.

From FIG. 33, it can be seen that in the case of photoresists having a photoactive compound weight ratio less than 16%, the residual layer proportion characteristic is equal to or less than 50% when the developing is performed for at least 20 seconds. If the developing step is performed for more than 20 seconds, the residual layer proportion characteristic can become less than 30%.

EXAMPLE 2

The Relationship Between the Developing Time and the Residual Layer Proportion Characteristic Ten different substrates were coated to a thickness of 10,000 Å with photoresist manufactured by the same method as Example 1 and having a photoactive compound weight ratio of 10 wt %. The substrates were soaked in a TMAH developing solution of 2.38 wt % for 10 seconds, 20 seconds, 30 seconds, 40 seconds, 50 seconds, 60 seconds, 70 seconds, 80 seconds, 90 seconds, and 100 seconds, respectively. The thicknesses of the remaining photoresist layers was measured. The results are illustrated in FIG. 34.

Figure 34:
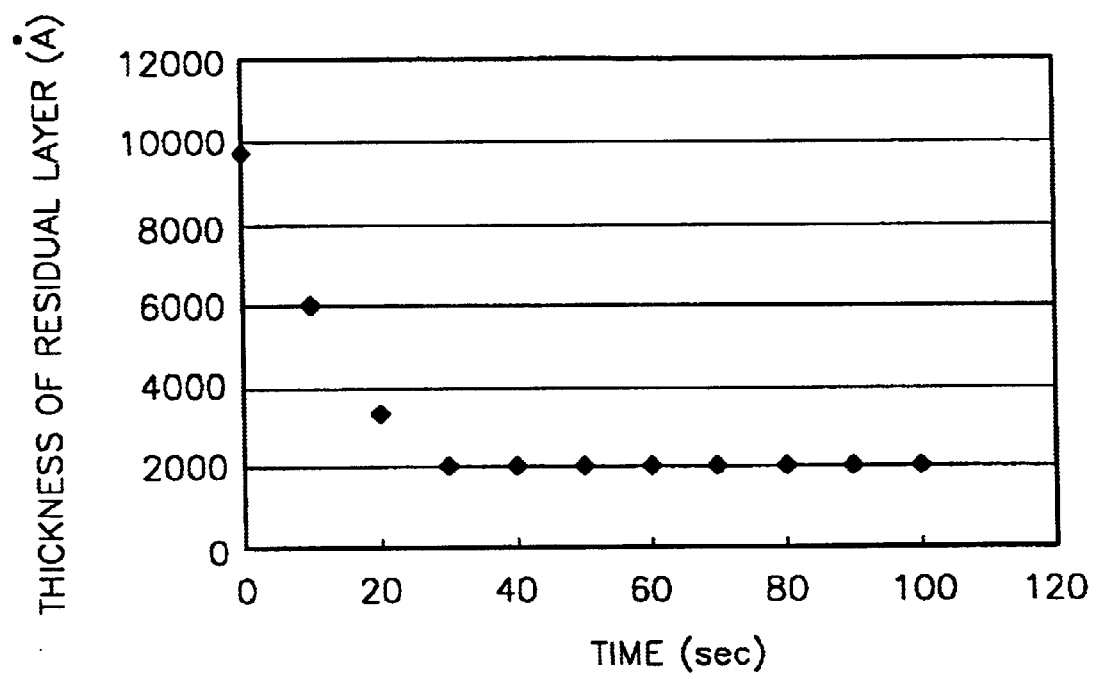
FIG. 34 is a graph illustrating changes in the residual layer proportion characteristic over developing time.

From FIG. 34, it is seen that the thickness of the photoresist layer is rapidly reduced for up to 30 seconds after the developing solution treatment begins. After 30 seconds, the thickness, and hence, the residual layer proportion characteristic, remains the same. Therefore, photoresist used in the present invention differs from a conventional photoresist in which the residual layer proportion characteristic remains higher than 90% (even though the residual layer proportion characteristic of the photoresist used in the present invention remains the same after a predetermined amount of time passes after the developing solution treatment has begun).

EXAMPLE 3

Figure 35:
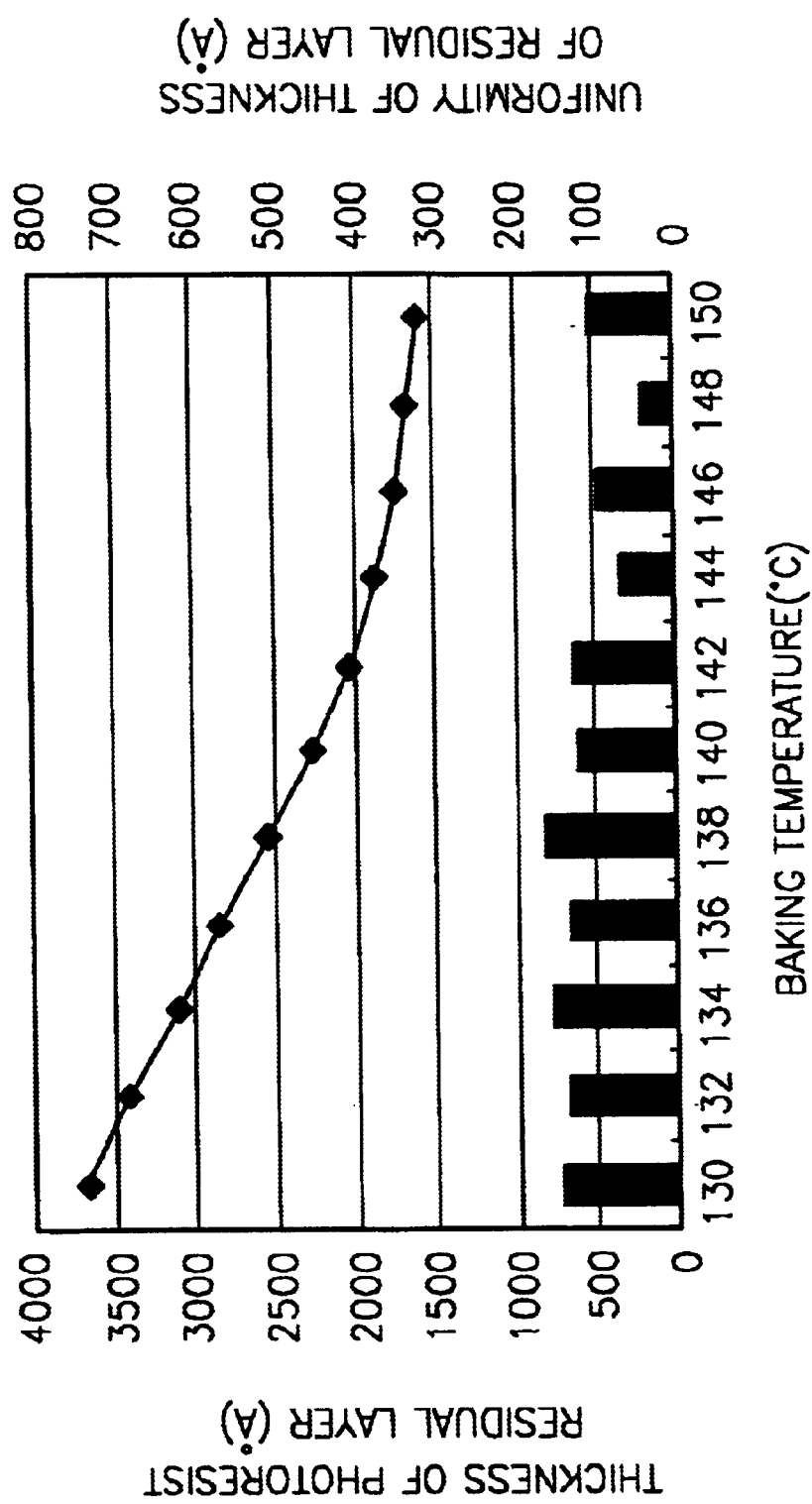
FIG. 35 is a graph of the thickness of a photoresist residual layer and the uniformity in residual layer thickness with respect to the baking temperature of a photoresist layer formed of a polymer including a t-butyloxycarbonyl group and an acetal group as a protecting group.

Affect of Baking Temperature on the Residual Layer Proportion Characteristic A plurality of samples were coated to a thickness of 6700 Å with photoresist formed of a polymer, including a t-butyloxycarbonyl group and an acetal group as a protecting group combined with a polyhydroxyphenol backbone. These samples were baked for 90 seconds at different baking temperatures and treated with a developing solution of 2.38 wt %. Then the residual layer proportion characteristic was determined for the samples. The results are shown in FIG. 35. As can be seen from FIG. 35, when the samples are baked at a temperature of 130–150° C., the residual layer proportion characteristic was 55–23%. In particular, the residual layer proportion characteristic was equal to or less than 30% at a temperature equal to or greater than 142° C. Also, the residual layer proportion characteristic of the photoresist on the plurality of samples was measured with respect to the respective baking temperatures, and the uniformity of the residual layer proportion characteristics were calculated. As a result, the uniformity is maintained to be equal to or less than 200 Å as shown in the bar graph. In particular, uniformity of the residual layer proportion characteristic being equal to or less than 100 Å at a temperature equal to or greater than 142° C. is very satisfactory.

EXAMPLE 4

Thermogravimetric Analysis of Photoresist with Respect to the Baking Temperature In order to investigate characteristics of the photoresist used in Example 3, the thermal weight was measured with respect to the different baking temperatures. The results are illustrated in FIG. 36.

Figure 36:
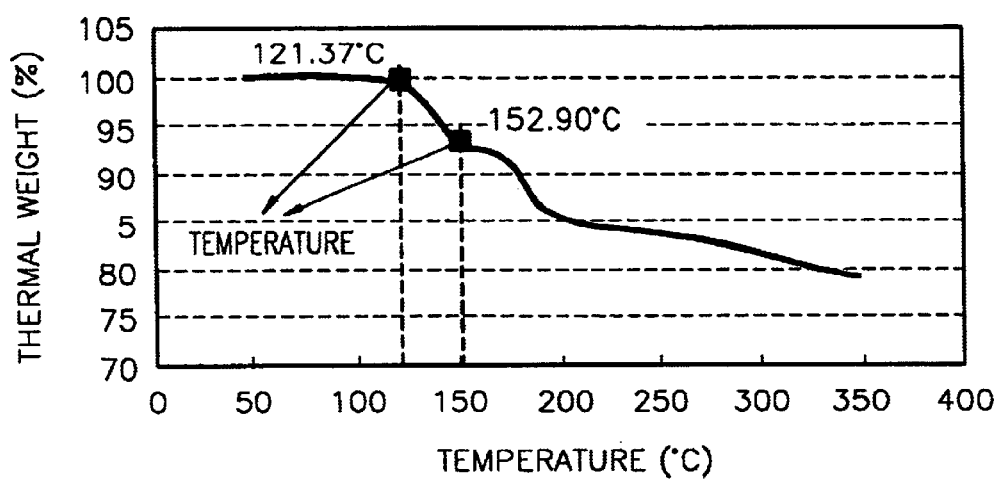
FIG. 36 is a temperature-to-thermogravimetric analysis (TGA) graph of photoresist formed of a polymer including a t-butyloxycarbonyl group and an acetal group as a protecting group.

As shown in FIG. 36, there is a tendency for the thermal weight to abruptly decrease once the baking temperature rises above 121.37° C. and again at 152.90° C. Therefore, the efficacy of the protecting groups must be decreased to attain a satisfactory residual layer proportion characteristic, i.e., the polymer must be de-protected. Note, the photoresist in the Examples includes two different protecting groups; therefore, a two-stage baking process is better-suited for decreasing the residual layer proportion characteristic than a one-stage baking process.

EXAMPLE 5

Thermogravimetric Analysis of the Photoresist with the Baking Temperature

In order to investigate processing conditions of the two-stage baking process suitable for producing the desired residual layer proportion characteristic in the photoresist layer used in Example 3, three substrates coated with the photoresist were baked at the baking temperatures and for time listed in the following table.

| | First Baking Stage | | Second Baking Stage | |
|---|---|---|---|---|
| Sample | Temperature (° C.) | Time (sec) | Temperature (° C.) | Time (sec) |
| 1 | 120 | 150 | 136 | 130 |
| 2 | 120 | 150 | 138 | 130 |
| 3 | 120 | 150 | 142 | 130 |

Figure 37:
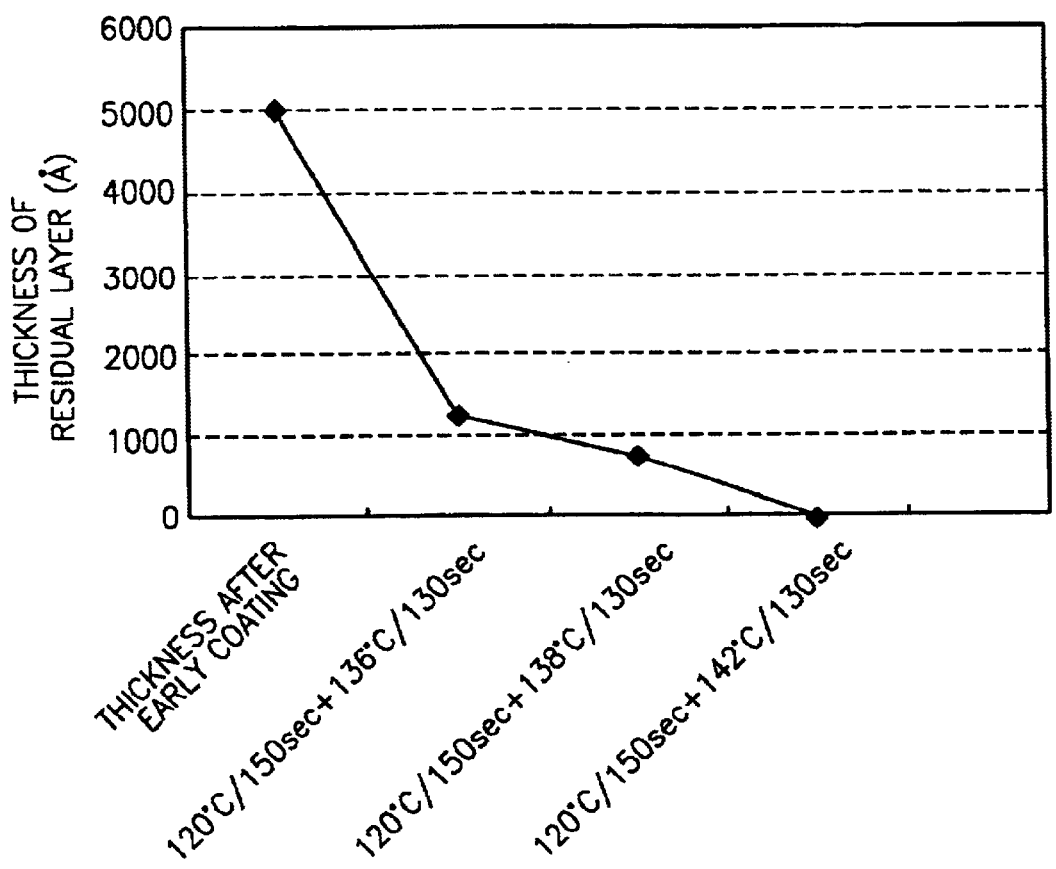
FIG. 37 is graph illustrating the residual layer proportion characteristic with respect to first and second baking temperatures and baking times of photoresist formed of a polymer including a t-butyloxycarbonyl group and an acetal group as a protecting group.

The results of these baking steps are shown in FIG. 37. As can be seen from FIG. 37, the desired residual layer proportion characteristic can be attained by baking the photoresist in multiple stages of certain temperatures and times.

According to the present invention, a photoresist pattern is formed without an exposure process by producing a residual layer proportion characteristic under which a certain amount of the photoresist will dissolve when soaked in developing solution. In particular, a photoresist having a residual layer proportion characteristic equal to or less than 80%, and preferably less than 50%, is formed on a stepped underlayer, the photoresist layer is soaked in a developing solution, and the portion of the photoresist layer covering the upper portion of the stepped underlayer is completely dissolved by the developing solution, leaving the photoresist only on the sidewalls of the stepped underlayer. Thus, the photoresist pattern is formed only by a developing process, i.e., without an exposure process. Therefore, the process is relatively simple. Thus, the method of the present invention completely avoids the possibility of the misalignment errors associated with the conventional exposure process, which errors become more prevalent the smaller the design rule becomes. Also, an anti-reflection layer for preventing irregular reflection is not required because an exposure process is not used.

Finally, although the present invention has been shown and described with reference to the preferred embodiments thereof, various changes in form and details, as will become apparent to those of ordinary skill in the art, may be made thereto without departing from the true spirit and scope of the invention as defined by the appended claims.

What is claimed is:

1. A method of forming a pattern in the manufacturing of a semiconductor device, comprising the steps of:

forming a target layer on a pattern defining a step on a substrate such that the target layer conforms to said pattern;

forming a photoresist layer on the target layer, whereby the photoresist layer has an upper surface situated above the target layer, and wherein the photoresist layer is of at least one photoresist composition selected from the group consisting of a first photoresist composition comprising a first novolak resin and a photoactive compound of 3–15 wt % based on the total weight of the first novolak resin, a second photoresist composition comprising a first novolak resin, a second novolak resin of 10–60 wt % based on the total weight of the first novolak resin and having a rate of dissolution in a developing solution of 300–1500 Å/sec, and a photoactive compound of 15–30 wt % based on the total weight of the first novolak resin, and a third photoresist composition comprising a first novolak resin, polyhydroxystyrene of 10–60 wt % based on the total weight of the first novolak resin, and a photoactive compound of 15–30 wt % based on the total weight of the first novolak resin;

dissolving a portion of the photoresist layer over a first area, without having exposed the photoresist layer in said first area, by soaking the photoresist layer in a developing solution until the upper surface thereof is situated below the upper surface of the step, and thereby leaving a portion of the photoresist layer undissolved over the entire said first area to form a photoresist pattern that exposes part of the target layer;

removing the exposed part of the target layer to form a pattern; and subsequently removing the photoresist pattern.

2. The method of claim 1, wherein said dissolving of the portion of the photoresist layer reduces the height of the photoresist layer to such an extent that the height of the photoresist pattern is 20–90% of the height of the step as measured from a surface of the substrate.

3. The method of claim 1, wherein the first novolak resin has an average molecular weight of 2000–10000 g/mole, and a polydispersity of 2.0–7.0.

4. The method of claim 1, wherein the photoresist layer is of at least said second photoresist composition, and the polyhydroxystyrene of said second photoresist composition has an average molecular weight of 3000–50000 g/mole, and a polydispersity of 1.1–3.0.

5. The method of claim 1, wherein the photoactive compound is a quinonediazide compound.

6. The method of claim 1, and further comprising a step of baking the substrate on which the photoresist layer has been formed before the photoresist layer is soaked in the developing solution.

7. The method of claim 6, wherein said baking comprises baking the substrate at a temperature of 130–160° C. for 30–120 seconds.

8. The method of claim 6, wherein said baking comprises first baking the substrate at a temperature of 90–120° C. for 30–120 seconds, and thereafter baking the substrate at a temperature of 130–160° C. for 30–120 seconds.

9. The method of claim 6, wherein the photoresist layer is formed of photoresist including a polymer, in which a t-butyloxycarbonyl group and an acetal group are combined with a backbone of the polymer as a protecting group, and a photoacid generator of 0.5–8 wt % based on the total weight of the polymer.

10. The method of claim 9, wherein the protecting group is 3–10 wt % based on the total weight of the backbone of the polymer.

11. The method of claim 9, wherein the backbone of the polymer is polyhydroxy phenol or novolak.

12. The method of claim 9, wherein the photoresist has an average molecular weight of 3000–20000 g/mole and a polydispersity of 1.3–3.5.

13. The method of claim 1, wherein said forming of the photoresist layer comprises providing photoresist that will dissolve in the developing solution at a rate of 500–1000 Å/sec.

14. The method of claim 13, wherein said dissolving of a portion of the photoresist layer over a first area comprises soaking the photoresist layer in a developing solution of 2.38 wt % of TMAH for 20–150 seconds.

15. The method of claim 13, wherein said dissolving of a portion of the photoresist layer over a first area comprises soaking the photoresist layer in a developing solution of NaOH or KOH for 20–200 seconds.

16. The method of claim 13, wherein said dissolving of a portion of the photoresist layer over a first area comprises soaking the photoresist layer in a developing solution of methanol or ethanol for 10–200 seconds.

17. The method of claim 13, wherein said dissolving of a portion of the photoresist layer over a first area comprises soaking the photoresist layer in a developing solution of choline for 20–200 seconds.

18. The method of claim 1, wherein the pattern is a gate pattern, and said dissolving of the portion of the photoresist layer reduces the height of the photoresist layer to such an extent that the height of the photoresist pattern is 20–90% of the height of the gate pattern as measured from a surface of the substrate.

19. A silicidation method in the manufacturing of a semiconductor device, comprising the steps of:

providing a substrate having a memory portion and a peripheral circuit and logic portion at the periphery of the memory portion, each of the memory portion and the peripheral circuit and logic portion comprising a gate pattern;

forming a target layer on the gate patterns of the peripheral circuit and logic portion and the memory portion of the substrate such that the target layer conforms to the gate patterns;

forming a photoresist layer on the target layer at both the memory portion and peripheral circuit and logic portion of the substrate, whereby the photoresist layer has an upper surface situated above the target layer, and wherein the photoresist layer is of at least one composition selected from the group consisting of a first photoresist composition comprising a first novolak resin and a photoactive compound of 3–15 wt % based on the total weight of the first novolak resin, a second photoresist composition comprising a first novolak resin, a second novolak resin of 10–60 wt % based on the total weight of the first novolak resin and having a rate of dissolution in a developing solution of 300–1500 Å/sec, and a photoactive compound of 15–30 wt % based on the total weight of the first novolak resin, and a third photoresist composition comprising a first novolak resin, polyhydroxystyrene of 10–60 wt % based on the total weight of the first novolak resin, and a photoactive compound of 15–30 wt % based on the total weight of the first novolak resin;

with respect to the photoresist layer formed at the memory portion and peripheral circuit and logic portion of the substrate, exposing only at least some of the photoresist layer that is located at the peripheral circuit and logic portion;

dissolving a portion of the photoresist layer over a first area at the memory portion of the substrate and dissolving all of the photoresist layer that has been exposed at the peripheral circuit and logic region, by soaking the photoresist layer in a developing solution until the upper surface thereof at the memory portion is situated below the upper surface of the gate pattern of the memory portion, and thereby leaving a portion of the photoresist layer undissolved over the entire said first area, whereby a photoresist pattern is formed that exposes part of the target layer at the memory portion of the substrate and that exposes at least part of the target layer on both the gate pattern and an active area of the peripheral circuit and logic portion of the substrate;

removing the exposed parts of the target layer at both the memory portion and peripheral circuit and logic portion of the substrate;

subsequently removing the photoresist pattern; and subsequently forming a suicide layer on the upper portion of the gate pattern of the memory portion, and in said active area and on the upper portion of the gate pattern of the peripheral circuit and logic portion.

20. The method of claim 19, wherein said dissolving of the photoresist layer at the memory portion of the substrate reduces the height of the photoresist layer to such an extent that the height of the photoresist pattern that is formed is 20–90% of the height of the pattern of gate pattern of the memory portion as measured from a surface of the substrate.

* * * * *